United States Patent [19]

Lee

[11] Patent Number: 5,343,170

[45] Date of Patent: Aug. 30, 1994

[54] VOLTAGE CONTROLLED OSCILLATOR PROVIDED WITH NEGATIVE FEEDBACK BIASING

[75] Inventor: Junseong Lee, Incheon, Rep. of Korea

[73] Assignee: Samsung Electronics Co., Ltd., Kyungki, Rep. of Korea

[21] Appl. No.: 2,266

[22] Filed: Jan. 8, 1993

[30] Foreign Application Priority Data

Jan. 8, 1992 [KR] Rep. of Korea .................. 92-161

[51] Int. Cl.$^5$ .................. H03B 5/00; H03H 11/00
[52] U.S. Cl. .................. 331/132; 331/8; 331/34; 331/115; 331/177 R; 333/213; 333/215
[58] Field of Search .............. 331/8, 34, 108 R, 115, 331/132, 177 R; 333/213, 215

[56] References Cited

U.S. PATENT DOCUMENTS 4,760,353  7/1988  Perkins .................. 331/115 X

OTHER PUBLICATIONS

Kawano et al., "A Single Chip Y/C Signal Processing IC for VHS VCRs", IEEE Transactions on Consumer Electronics, Electronics, vol. 35, No. 4, Nov., 1989, pp. 744-745.

*Primary Examiner*—David Mis
*Attorney, Agent, or Firm*—Cushman, Darby & Cushman

[57] ABSTRACT

A voltage controlled oscillator (VCO) including a negative feedback circuit operates in response to a negative feedback signal generated during active transistor region operation of transistors in transconductance amplifying stages coupled thereto. As a result, harmonic distortion and problems of noise and unstable frequency oscillation are obviated or significantly reduced. The VCO includes first and second variable transconductance (gm) amplifying stages whose non-inverting (+) and inverting (−) terminals are respectively grounded and a first condenser connected between an output terminal of the first transconductance (gm) amplifying stage and a non-inverting (+) terminal of the second transconductance (gm) amplifying stage. A negative-resistive circuit is used to provide a negative feedback.

20 Claims, 3 Drawing Sheets

VOLTAGE CONTROLLED OSCILLATOR PROVIDED WITH NEGATIVE FEEDBACK BIASING

BACKGROUND OF THE INVENTION

1. Field of the Invention

The present invention relates to an oscillating circuit. More particularly, the present invention relates to a variable frequency oscillating circuit having broad variable range frequency application, excellent high frequency characteristics, and improved frequency selectivity.

2. Description of the Art

Advances in semiconductor fabrication techniques have drastically changed the way designers approach circuit design problems. Highly complex analog/digital circuits can now be formed on large scale semiconductor integrated circuits. As a result, problems of reliability and device stability are substantially mitigated by mass produced integrated circuit component substitutes which are significantly more miniature and cheaper to manufacture.

Signal-processing systems formed almost entirely on a single integrated circuit chip have been successfully used in connection with audio systems and video cassette recorders. Such signal-processing systems consist essentially of a phase locked loop (PLL) circuit capable of providing stable signal processing using highly reliable circuit components fabricated on a single integrated circuit.

Phase locked loop (PLL) circuits having a voltage controlled oscillator (VCO) included therewith are common. One well known voltage controlled oscillator (VCO), in particular, comprises a band pass filter and a positive feedback amplifier and is shown in FIG. 1. This VCO was described in an article in IEEE Transactions on Consumer Electronics, Vol. 35, No. 4, pp. 744–745, published November 1989.

In the voltage controlled oscillator (VCO) of prior art FIG. 1, there is provided a band pass filter BPF 1 and feedback amplifier 4. This circuit is designed to oscillate at an intermediate frequency of the BPF, the intermediate frequency controlling an output voltage.

BPF 1 comprises variable transconductance (gm) amplifiers 2 and 3 and condensers $C_0$, as shown in FIG. 1. Feedback amplifier 4 comprises resistance R and a voltage-current converter 5. Voltage-current converter 5 acts as a current mirror to selectively output variable current $I_0$ in response to variable voltage $V_0$.

Variable voltage $V_0$ is output from BPF 1 and coupled as a feedback signal to voltage-current converter 5. Variable voltage $V_0$ output from BPF 1 serves as an output of the voltage controlled oscillator and is coupled to a phased locked loop (PLL) circuit (not shown).

Variable voltage $V_0$ can be expressed by the following equation:

$$V_o = \frac{w_o S(RI_o)}{S^2 + \frac{w_o}{Q_o} S + w_o^2} \quad (1)$$

where $w_0 = gin/C_0$ and $Q_0 = 1/(gmR)$. Also, $s = jw_0 = j2\pi f_0$— for example, condenser impedance $z_c = \frac{1}{2}\pi f_c = 1/s_c$

Load resistor R serves as a damper to BPF 1, the resistance value selected to control the selectivity $Q_0$ of the band pass filter. It is important to select a low value load resistance R in order to achieve high selectivity. Similarly, a low value load resistance results in greater frequency stability during VCO oscillation as it supplies the variable voltage $V_0$ as an input to feedback amplifier 4. Oscillating frequency $f_0$ can be derived from equation (1) above as:

$$f_o = \frac{I_x}{2\pi C_o V_{DC}},$$

where
$f_0 = w_0/2\pi$.

Frequency $f_0$ varies with the voltage-controlled current $I_x$. When the frequency corresponds with the predetermined intermediate frequency, current $I_x$ shifts to compensate for any variations in impedance. Thus, $I_x$ is variable in order to adjust frequency $f_0$ to the necessary value.

A stable oscillation requires a definite amplitute of output voltage $V_0$. When oscillation is at a frequency $f_0$, equation (1) can be rewritten as:

$$V_o = \frac{I_o}{I_x} V_{DC}.$$

If current $I_0$ from voltage-current converter 5 in feedback amplifier 4 is designed to be proportional to variable current $I_x$, the amplitude of output voltage $V_0$ remains constant even if control voltage $V_{CTL}$ changes.

A transconductance value for each of variable transconductance amplifiers 2 and 3 in the circuit of prior art FIG. 1 can be derived as a function of the ratio of control voltage $V_{CTL}$ to feedback current $I_0$.

The above described voltage controlled circuit of the prior art FIG. 1 has the following problems.

A positive feedback principle of operation is necessary so as to stably maintain a variable frequency output therefrom. As a result, active elements forming the variable transconductance (gm) amplifiers 2 and 3 operate in a non-linear operating region of a characteristic curve, unstably affecting the operating characteristics of the respective amplifiers and resulting in instability of the signal waveform output therefrom.

Because in this particular case, transconductance value (gm) is a function of frequency, unstable gm values render inoperable a wide portion of the variable range of the oscillating frequency of the VCO and reduce stability in the high frequency spectrum due to deterioration in signal response.

Large differences thus exist between desired transconductance values and transconductance values otherwise generated by variable current $I_0$ from the positive feedback system.

Higher harmonics of distorted waveform are also present in the prior art circuit resulting in unwanted noise in the input waveform of adjoining circuits coupled thereto.

SUMMARY OF THE INVENTION

An object of the present invention is to provide a variable frequency oscillating circuit having a large oscillating frequency variable range and which operates with high stability of oscillation and with no oscillating wave form distortion.

The present invention particularly includes a negative feedback system, such as a negative resistive circuit, coupled between a pair of transconductance amplifiers.

More specifically, the present invention includes a variable frequency oscillating circuit which includes:

first and second variable transconductance (gm) amplifying stages whose non-inverting (+) and inverting (−) terminals are respectively grounded;

a first condenser connected between an output terminal of the first transconductance (gm) amplifying stage and a non-inverting (+) terminal of the second transconductance (gm) amplifying stage;

a negative-resistive circuit providing negative feedback and coupled to said first and second variable transconductance (gm) amplifying stages; and a second condenser connected between an output terminal of the second transconductance (gm) amplifying stage and an inverting (−) terminal of the first transconductance (gm) amplifying stage, the first and second transconductance (gm) amplifying stages changing a corresponding transconductance (gm) value thereof in response to a variable direct current control input voltage to selectively output a corresponding frequency signal from said second transconductance (gm) amplifying stage in response thereto.

BRIEF DESCRIPTION OF THE DRAWINGS

The above and further objects, features and advantages of the present invention will become more apparent from the following detailed description of embodiments taken in conjunction ith the accompanying drawings, wherein.

DETAILED DESCRIPTION OF THE PREFERRED EMBODIMENTS

Figure 2:
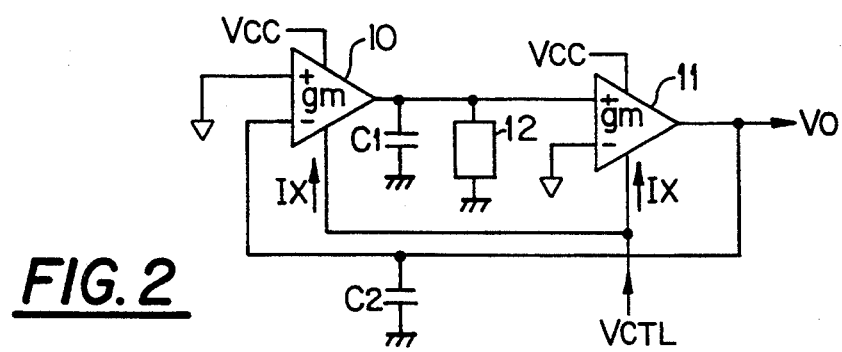
FIG. 2 is a circuit diagram of a voltage controlled frequency oscillating circuit according to the present invention.

A voltage controlled frequency oscillating circuit in accordance with the present invention is illustrated in FIG. 2.

A first transconductance (gm) amplifying stage 10 is formed on an integrated circuit together with a second transconductance (gm) amplifying stage 11. The operating characteristics of amplifying stages 10 and 11 are substantially similar and will be discussed in greater detail below in connection with FIGS. 4A and 4B.

Negative-resistive circuit 12 is coupled between first amplifying stage 10 and second amplifying stage 11 to act as a negative feedback amplifier. Negative-resistive circuit 12 also controls selectivity and increases frequency stability.

In a transconductance (gm) amplifier as adopted in the present invention, a transconductance value (gm) varies as a function of voltage control signal $V_{CTL}$ and voltage-controlled current $I_x$ to change an output oscillating frequency thereof.

Voltage control signal $V_{CTL}$ can be an externally provided condition signal from which a particular oscillating frequency is to be determined. Voltage control signal $V_{CTL}$ is identical in purpose and effect as that illustrated in connection with prior art FIG. 1.

Figure 1:
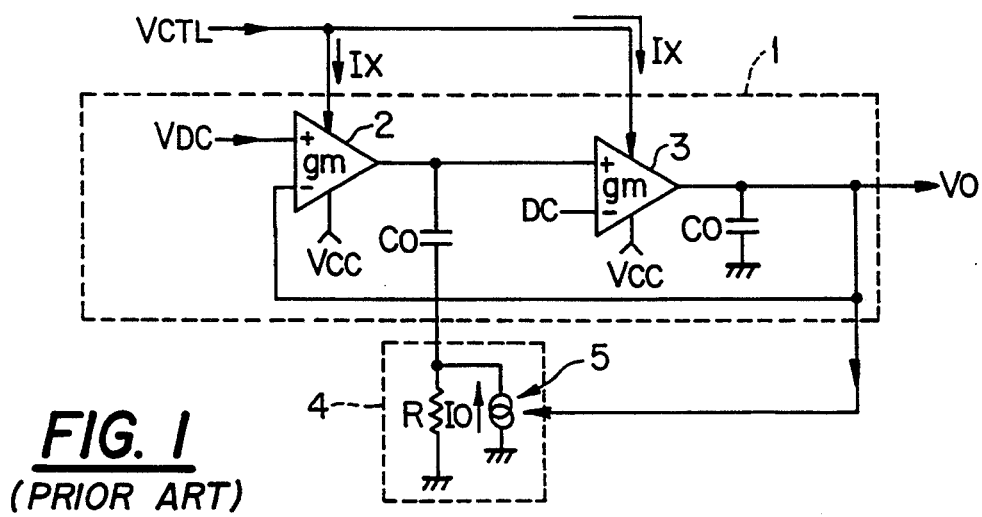
FIG. 1 is a circuit diagram of a conventional voltage controlled oscillator circuit.

However, unlike the transconductance amplifiers 2 and 3 of prior art FIG. 1, amplifying stages 10 and 11 of the present invention operate with greater stability in providing a varying oscillating frequency output signal $V_0$ in response to a variation in an input voltage control signal $V_{CTL}$.

Figure 3:
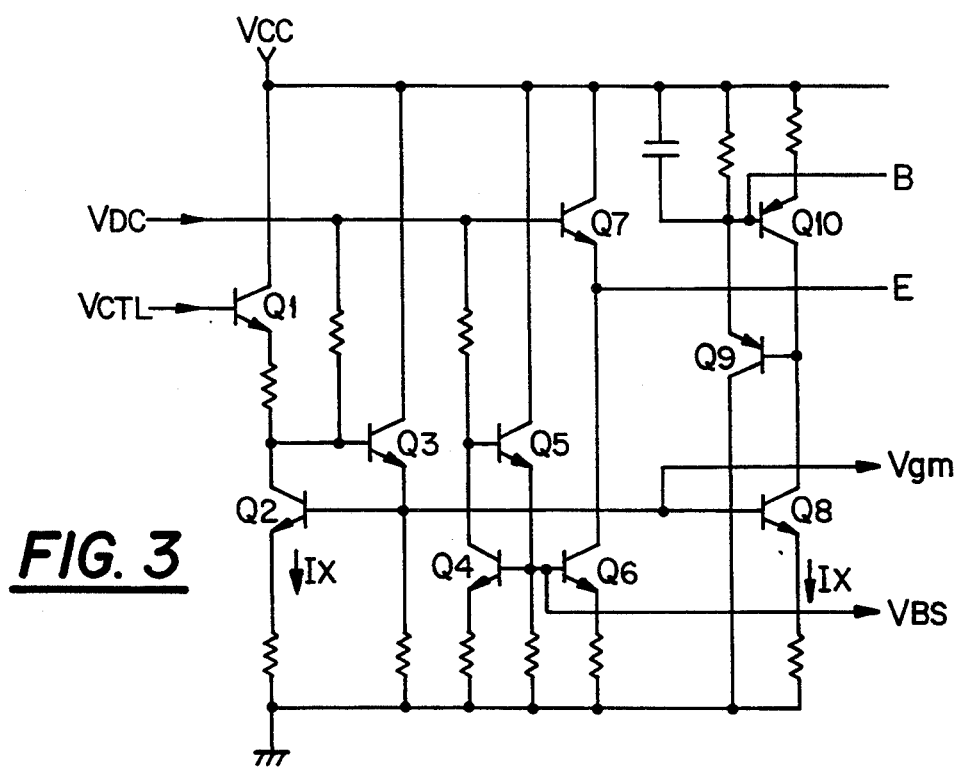
FIG. 3 is a schematic circuit diagram of a pre-circuit of the voltage controlled frequency oscillating circuit in FIG. 2.

FIG. 3 shows a pre-circuit which is connected as a front input stage to amplifying stages 10 and 11. The pre-circuit of FIG. 3, includes transistors Q1 to Q10 and a number of bias and load transistors selectively arranged to generate a number of amplifier stage input bias and control signals.

The pre-circuit of FIG. 3 outputs a bias signal $V_{BS}$ and a transconductance control signal Vgm in response to constant bias voltage $V_{DC}$ and voltage control signal $V_{CTL}$.

At Node E, the pre-circuit couples a non-inverting terminal of amplifying stage 10 and an inverting terminal of amplifying stage 11 to (virtual) ground (i.e., the ground reference level is preset as a function of the amplitude level of constant bias voltage $V_{DC}$ as coupled via Q6.

Constant direct current voltage $V_{DC}$ generates constant current flow to current mirror transistors Q4 and Q6.

As a result, a constant bias current flows to current mirror transistors Q18 and Q19 of amplifying stages 10 and 11, respectively. Transistors Q18 and Q19 are coupled to the interconnecting bases of current mirror transistors Q4 and Q6.

Voltage control signal $V_{CTL}$ functions as both a control voltage and a variable voltage level signal. Voltage control signal $V_{CTL}$ can be set manually using a voltage setting dial, or automatically as when the voltage control oscillating circuit is to be used in a PLL circuit.

The voltage controlled frequency oscillating circuit of the present invention outputs a signal $V_0$ having a frequency determined as a function of the variable voltage level of the input voltage control signal $V_{CTL}$.

Current mirror transistors Q2 and Q8 are coupled via Q1 and Q3 to voltage control signal $V_{CTL}$. Voltage control signal $V_{CTL}$ is provided to change the transconductance values of first and second amplifying stages 10 and 11 by selective bias thereto and by varying Q2 and Q8 transistor current flow.

By varying the transconductance value of the respective amplifying stages, the oscillating output frequency signal $V_0$ will also vary therewith. The relationship of the bias signals from the pre-circuit is made obvious in connection with a discussion of amplifying stages 10 and 11 of FIGS. 4A and 4B.

Figure 4B:
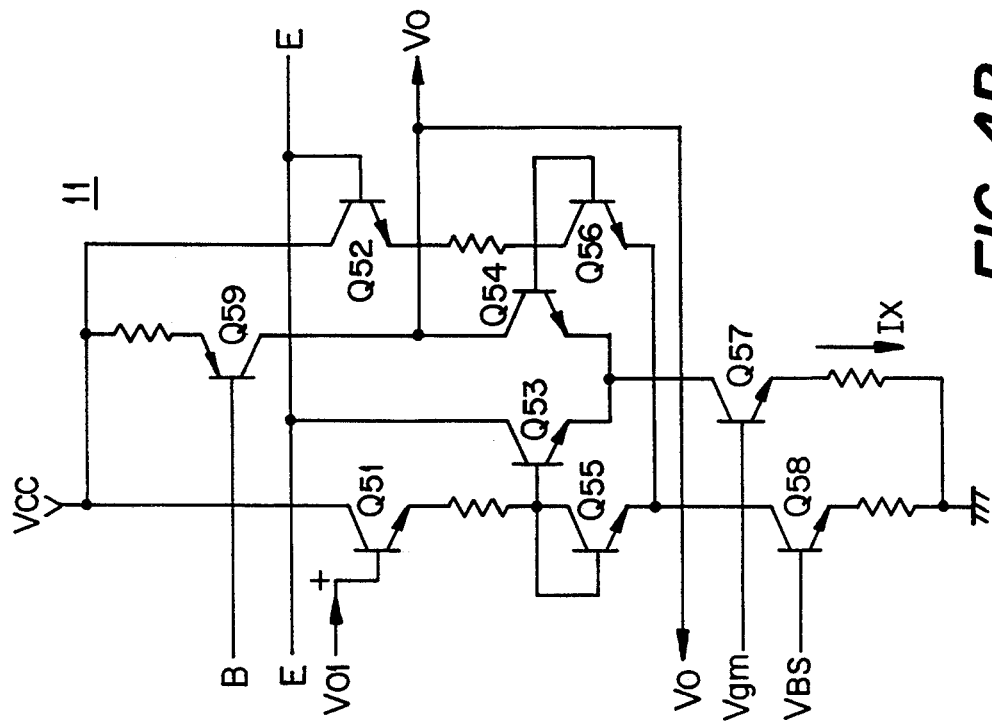
FIGS. 4A and 4B are schematic circuit diagrams of first and second transconductance (gm) amplifiers, respectively, of the voltage controlled frequency oscillating circuit in FIG. 2.
Figure 4A:
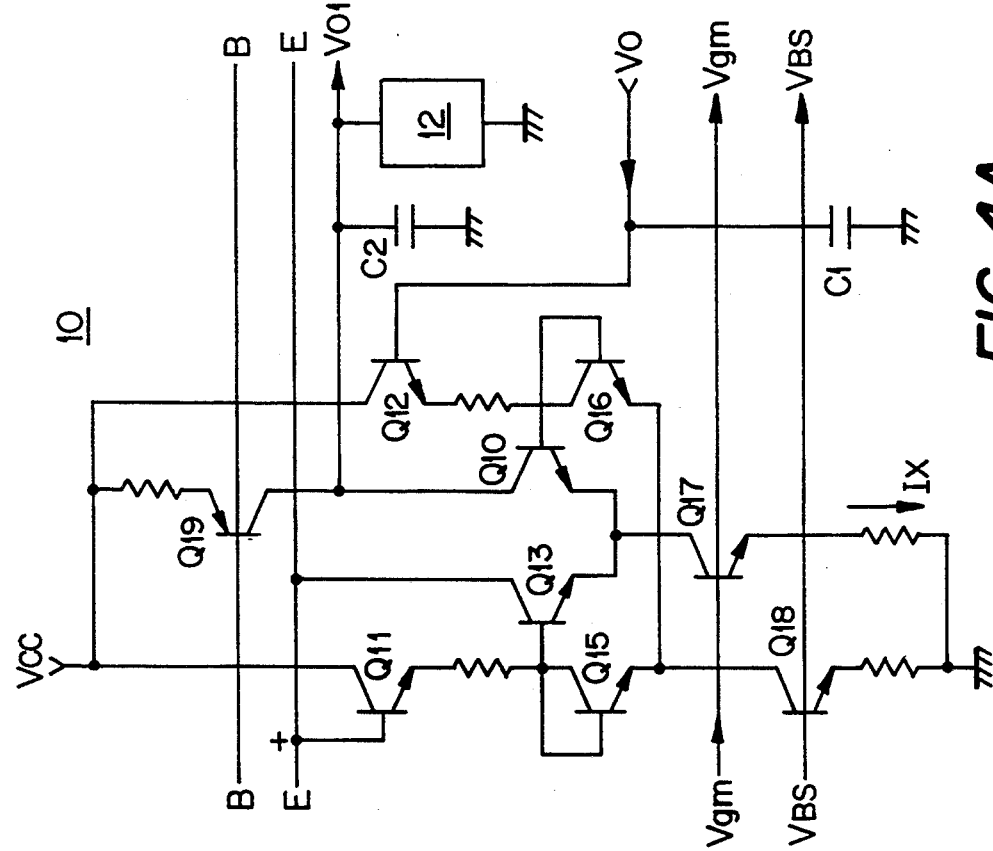

FIG. 4A shows first transconductance amplifying stage 10 connected at nodes B and E and connected to receive voltage signals Vgm and $V_{BS}$ from the pre-circuit shown in FIG. 3.

Output signal $V_{01}$ from amplifying stage 10 is coupled via condenser C2 and negative-resistive circuit 12 (shown in FIG. 5) to second amplifying stage 11 of FIG. 4B.

A non-inverting terminal of amplifying stage 10 is directly coupled to Node E of FIG. 3, and also to a non-inverting terminal of the second amplifying stage shown in FIG. 4B.

Oscillating frequency voltage signal $V_0$ is connected to an inverting terminal of first amplifying stage 10 to provide a negative feedback signal thereto (see FIG. 4A). The inverting terminal of first amplifying stage 10 is connected to the base of transistor Q12, and also coupled to ground via condenser C1.

Signals Vgm and $V_{BS}$ from the pre-circuit of FIG. 3 are respectively connected to transistors Q17 and Q18 of first amplifying stage 10 and transistors Q57 and Q58 of second amplifying stage 11 as shown in FIGS. 4A and 4B.

When transconductance values vary in response to a change in bias mirror current $I_x$ of current mirror transistors Q17 and Q57 of amplifying stages 10 and 11, respectively, current flowing in the collectors of transistors Q8, Q17 and Q57 is maintained at equal levels.

At such time as there is a change in bias mirror current $I_x$ of current mirror transistors Q17 and Q57, the collector current of transistor Q10 in the pre-circuit of FIG. 3 is also varied to equal that of transistors Q8, Q17 and Q57.

Transistor Q10 forms a current mirror with transistors Q19 and Q59 of amplifying stages 10 and 11 respectively such that corresponding transconductance changes are stably performed.

Transconductance (gm) relates to the change of output current of an amplifying stage relative to its input voltage. The voltage oscillating circuit of the present invention thus operates to vary a current $I_x$ (see FIG. 3) in order to generate a new oscillating frequency output signal $V_0$ as a function of the transconductance values of the respectively coupled amplifying stages 10 and 11.

The use of current mirrors in the present invention to control the setting of transconductance values results in a voltage controlled oscillating frequency circuit which generates an oscillating frequency signal having a wide operating variable frequency range and which is "linearly" dependent on the transconductance values (gm) of the respectively coupled amplifying stages.

Although a change in the transconductance value (gm) results from a change in the input voltage control signal $V_{CTL}$, the transconductance values of the respective amplifying stages do not otherwise contribute to an unstable, distortive, or noise signal effect on the oscillating frequency voltage signal output therefrom.

Figure 5:
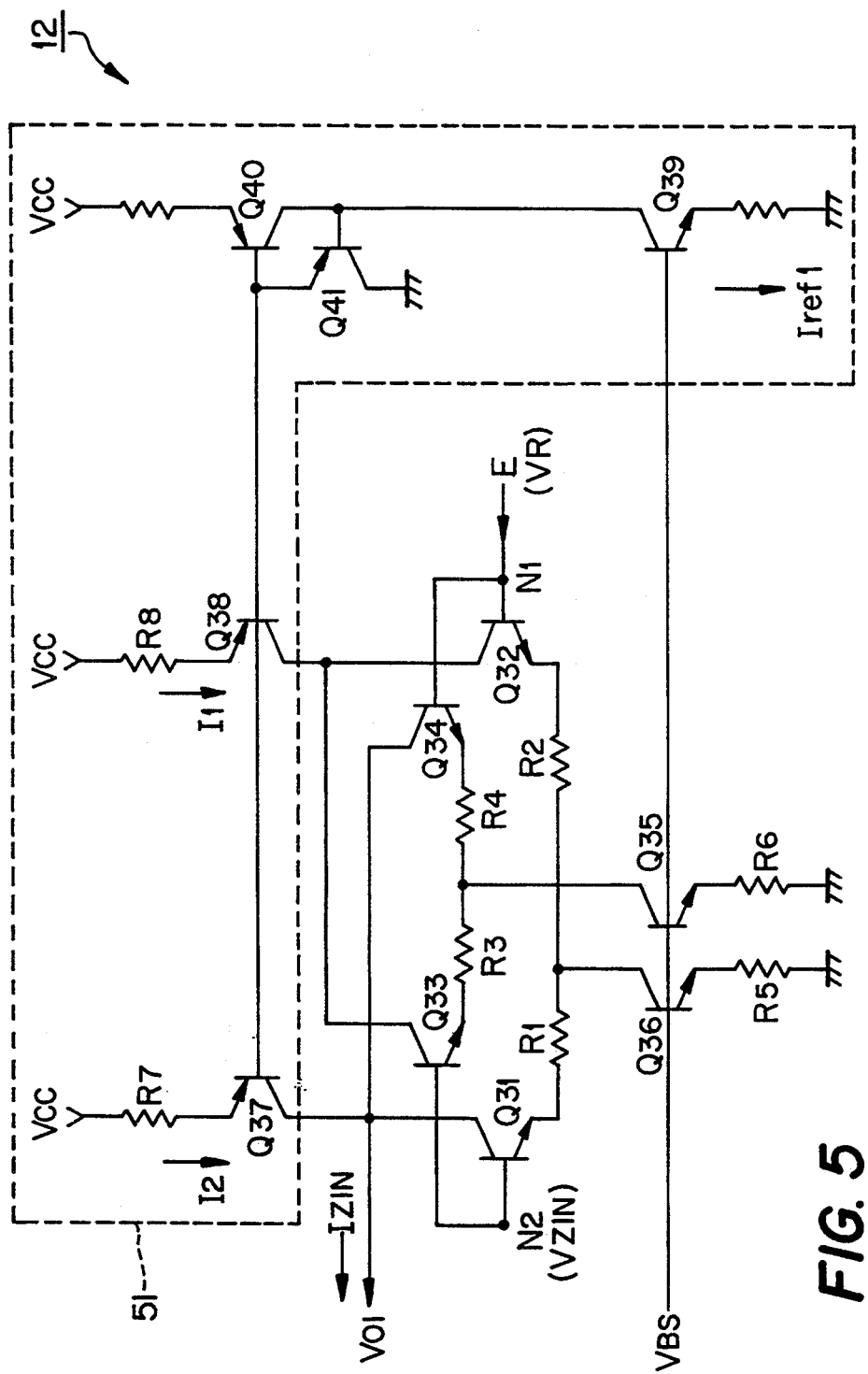
FIG. 5 is a schematic circuit diagram of a negative resistive circuit according to the present invention.

Voltage $V_{01}$ is generated by negative resistive circuit 12 coupled to first amplifying stage 10 and second amplifying stage 11 as indicated in the combination of FIGS. 4A, 4B and 5. Voltage $V_{01}$ is shown input to a non-inverting terminal of second amplifying stage 11.

The transfer function of output oscillating frequency voltage $V_0$ in the circuit of FIG. 2 and as it relates to the negative-resistive circuit 12 can be expressed by the following equation:

$$V_o = \frac{\frac{gm}{C} s}{s^2 + \frac{G}{C_1} s + \frac{gm_1 gm_2}{C_1 C_2}} \quad (2)$$

where $s = jw_0$, which is also equal to $j2\pi f_0$, and $w_0 = gm/C$.

In the above equation, $gm_1$ and $gm_2$ correspond to the transconductance values of each of first and second amplifying stages 10 and 11, respectively, gm being a value for which $gm_1$ and $gm_2$ are of equal value. It is not imperative that $gm_1$ and $gm_2$ are equal although high accuracy is obtained when equal.

Variable C is used to represent a value for which condenser $C_1$ and condenser $C_2$ are selected to be of equal value. Similarly, it is not imperative that $C_1$ and $C_2$ are equal although high accuracy is obtained when equal.

$Q_0$ is proportional to:

$$Zin \text{ and } \frac{gm}{c},$$

and G is an equivalent conductance.

Zin is node impedance at Node N2 of FIG. 5.

Next, defining an oscillating frequency $f_0$ as $I_x/2\pi CV_{DC}$ and derived from the above transfer function, an oscillating frequency is derivable from selected values of gm and C.

$I_x$ corresponds to the equal collector current at transistors Q2, Q17 and Q57. $V_{DC}$ is a bias voltage of a transconductance (gm) amplifying stage. Accordingly, any variation in current $I_x$ will cause the oscillating frequency to vary.

Selectivity is controlled in the circuit of the present invention using negative-resistive circuit 12. Node $V_{01}$ of FIG. 4A is connected to node $V_{01}$ of FIG. 5 and node E of FIG. 4A is connected to node E of FIG. 5. When the voltage at $V_{01}$ increases, current flow $I_{zin}$ increases in the direction shown by the corresponding $I_{zin}$ arrow in FIG. 5 to provide a negative feedback effect on first and second amplifying stages 10 and 11.

Negative-resistive circuit 12 includes a reference current supply portion 51 comprising transistors Q32 and Q33 for receiving a first reference current I1, and transistors Q31 and Q34 for receiving a second reference current I2.

Bias transistor Q35 is connected to a node between series resistors R3 and R4. Series resistors R3 and R4 are in turn connected to the emitters of transistors Q33 and Q34 respectively.

Bias transistor Q36 is connected to a node between series resistors R1 and R2. Series resistors R1 and R2 are connected to the emitters of transistor Q31 and Q32 respectively.

The bases of transistors Q33 and Q34 are respectively connected to the bases of (node $N_2$) transistor Q31 and (node $N_1$) transistor Q32. The voltage $V_{zin}$ and current signals at node N2 are characteristically of negative resistivity.

Resistors R7 and R8 connected to a common power supply voltage are connected to the respective collectors of transistors Q37 and Q38. Reference currents I2 and I1 are proportionately related (in accordance with a current mirror relation) to a reference current Irefl generated by transistors Q39 to Q41 comprised within reference current supply portion 51.

Currents I1 and I2 are of equal value and are provided by reference current supply portion 51 (as shown in FIG. 5) to transistor collectors Q31 / Q34 and Q33 / Q32 respectively.

When voltages $V_R$ and $V_{zin}$ at nodes N1 and N2 are at equal potential, a collector current at Q31 is the same as the collector current at Q32. Similarly, the collector current of Q33 is the same as the collector current at Q34.

When bias voltage $V_{zin}$ at node 2 is higher than voltage $V_R$ at Node N1, a collector current at Q31 will be greater than the collector current at Q32. Similarly, a collector current at Q33 will be greater than the collector current at Q34.

When the resistor values for a condition other than one where $V_R$ and $V_{zin}$ are equal, are such that R1=R2>R3=R4 and R6>R5, the range of current variation at the collector of Q33 will be greater than that at the collector of Q31 within the same voltage variation range.

The collector current of Q33 flows from first reference current I1 of Q38. The collector current of Q34 similarly flows from second reference current I2 of Q37.

Accordingly, when bias voltage $V_{zin}$ at Node N2 is higher than the potential $V_R$ at Node N1, the collector current of Q38 will cause an increase in the collector current of Q33, and a decrease in the collector current of Q32. At the same time, the collector current of Q37 will increase the collector current of Q31, and decrease the collector current of Q34.

However, because the decrease in collector current at Q34 is less than the increase in collector current at Q31, a portion of second reference current I2 will flow into node N2 (in the direction of $+I_{zin}$).

Conversely, when $V_{zin} < V_R$ a current increase at the collector of Q34 is supplied from the bias potential at node N2 (in the direction of $-I_{zin}$).

In short, if the potential $V_{zin}$ at node N2 increases, $I_{zin}$ becomes more positive "+" and if the potential $V_{zin}$ at node N2 decreases, $I_{zin}$ becomes more negative "−".

Voltage increases and decreases are therefore inversely proportional to current increases and decreases, and an impedance at node N2 becomes a negative one.

As shown in FIG. 5, Node N1 is connected to Node E from FIGS. 3, 4A and 4B. Voltage signal $V_{01}$ from first amplifying stage 10 is connected via condenser C2 and impedance Zin of negative resistive circuit 12 at node N2, to couple to second amplifying stage 11 at the non-inverting terminal thereof.

Negative-resistive circuit 12 is therefore coupled to the non-inverting (+) terminal of second amplifying stage 11 with a negative impedance value, and an oscillating condition is made by negative feedback and negative resistance.

Thus, contrary to a positive feedback system conventional in prior art voltage controlled frequency oscillating circuits, the transistors in second amplifying stage 11 operate in the active region responsive to the negative impedance effect provided by negative-resistive circuit 12.

As a result, the present invention results in a device which characteristically provides a more stable varying frequency output signal over a large voltage range variation with enhanced linearity of response.

Moreover, because the device operates in response to a negative feedback signal generated during active transistor region operation of the amplifying stages coupled thereto, harmonic distortion and problems of noise and unstable frequency oscillation are obviated or significantly reduced.

The feedback frequency voltage signal $V_0$ of the voltage controlled frequency oscillating circuit (VCO) of the present invention may be an output signal of frequency 5.04 MHz for use in a phase locked loop (PLL) system to be employed in such appliances as video cassette recorders.

Thus, this feedback frequency voltage signal $V_0$, while an oscillating input to the inverting terminal of first amplifying stage 10, it also is intended to be used as an input to a subsequent stage, such as a phase modulating or frequency modulating stage of a phase locked loop (PLL).

In first amplifying stage 10, the respective transistors operate and oscillate in the active region to generate an output signal $V_{01}$ which is fed as an input to a subsequent circuit second amplifying stage 11.

Negative-resistive circuit 12 provides a negative impedance reference to second amplifying stage 11, notwithstanding variations in the transconductance values of the amplifying stages. Thus, every time, a new $V_{CTL}$ voltage level is generated at the pre-circuit stage of the present invention, the transconductance values of the amplifying stages will bring about a change in the $V_{01}$ value generated by first amplifying stage 10. As a consequence, the negative impedance reference level will change to compensate accordingly.

The present invention thus provides an improved voltage controlled oscillating circuit having increased frequency stability over a wide voltage variation range.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A variable frequency oscillating circuit including first and second variable trans-conductance (gm) amplifying stages whose non-inverting (+) and inverting (−) terminals are respectively coupled to ground, said first and second transconductance (gm) amplifying stages changing a corresponding transconductance (gm) value associated therewith in response to a variable direct current input signal, and selectively outputting a frequency signal from said second transconductance (gm) amplifying stage in response to said variable direct current input signal, said variable frequency oscillating circuit further comprising:

a negative-resistive circuit for providing negative feedback connected to a node between said first and second variable transconductance (gm) amplifying stages.

2. The variable frequency oscillating circuit of claim 1, wherein said negative-resistive circuit includes a reference current supply portion and a negative-feedback bias portion, said negative resistive circuit comprising:

first and second transistors Q32 and Q33 receiving a first reference current I1 from said reference current supply portion;

third and fourth transistors Q31 and Q34 receiving a second reference current I2 from said reference current supply portion;

a biasing transistor Q35 coupled to a first resistor R6 and connected to a node between a first set of serially-connected resistors R3 and R4, said first set of serially-connected resistors R3 and R4 being connected at opposite ends to the respective emitters of said second and fourth transistors Q33 and Q34; and fifth transistor Q36 coupled to a second resistor R5 and connected to a node between a second set of serially-connected resistors R1 and R2, said second set of serially-connected resistors connected at opposite ends to the respective emitters of said first and third transistors Q31 and Q32, the respective bases of said second and fourth transistors Q33 and Q34 being connected respectively to the collector (node N2) of said first transistor Q31 and to the collector (node N1) of said third transistor Q32, such that a voltage potential $V_{zin}$ and a current $I_{zin}$ at the collector (node N2) of said first transistor Q31, are in negative-resistive characteristic relationship.

3. The variable frequency oscillating circuit of claim 2, wherein said reference current supply portion includes third and fourth resistors R8 and R7, said first and second reference currents I1 and I2 coming from a supply voltage source and associated with a corresponding one of fifth and sixth transistors Q37 and Q38 connected to respective ones of said third and fourth resistors R8 and R7 to form a current mirror with seventh transistor Q40, the current values of said first and second reference currents I1 and I2 being of equal value.

4. The variable frequency oscillating circuit of claim 2, wherein the resistance value of said first set and second set of serially connected resistors is as follows:

R1=R2>R3=R4.

5. The variable frequency oscillating circuit of claim 3, wherein the resistance value of said first set and second set of serially connected resistors is as follows:

R1=R2>R3=R4.

6. The variable frequency oscillating circuit of claim 1, further comprising:

a first condenser connected between an output terminal of the first transconductance (gm) amplifying stage and a non-inverting (+) terminal of the second transconductance (gm) amplifying stage; and a second condenser connected between an output terminal of the second transconductance (gm) amplifying stage and an inverting (−) terminal of the first transconductance (gm) amplifying stage.

7. The variable frequency oscillating circuit of claim 2, further comprising:

a first condenser connected between an output terminal of the first transconductance (gm) amplifying stage and a non-inverting (+) terminal of the second transconductance (gm) amplifying stage; and a second condenser connected between an output terminal of the second transconductance (gm) amplifying stage and an inverting (−) terminal of the first transconductance (gm) amplifying stage.

8. The variable frequency oscillating circuit of claim 3, further comprising:

a first condenser connected between an output terminal of the first transconductance (gm) amplifying stage and a non-inverting (+) terminal of the second transconductance (gm) amplifying stage; and a second condenser connected between an output terminal of the second transconductance (gm) amplifying stage and an inverting (−) terminal of the first transconductance (gm) amplifying stage.

9. The variable frequency oscillating circuit of claim 4, further comprising:

a first condenser connected between an output terminal of the first transconductance (gm) amplifying stage and a non-inverting (+) terminal of the second transconductance (gm) amplifying stage; and a second condenser connected between an output terminal of the second transconductance (gm) amplifying stage and an inverting (−) terminal of the first transconductance (gm) amplifying stage.

10. The variable frequency oscillating circuit of claim 5, further comprising:

a first condenser connected between an output terminal of the first transconductance (gm) amplifying stage and a non-inverting (+) terminal of the second transconductance (gm) amplifying stage; and a second condenser connected between an output terminal of the second transconductance (gm) amplifying stage and an inverting (−) terminal of the first transconductance (gm) amplifying stage.

11. A phase locked loop (PLL) circuit having a variable frequency oscillating circuit which includes first and second variable trans-conductance (GM) amplifying stages whose non-inverting (+) and inverting (−) terminals are respectively coupled to ground, said first and second transconductance (gm) amplifying stages changing a corresponding transconductance (gm) amplifying stages changing a corresponding transconductance (gm) value associated therewith in response to a variable direct current input signal, and selectively outputting a frequency signal from said second transconductance (gm) amplifying stage in response to said variable direct current input signal, said variable frequency oscillating circuit further comprising:

a negative-resistive circuit for providing negative feedback connected to a node between said first and second variable transconductance (gm) amplifying stages.

12. The PLL circuit of claim 11, wherein said negative-resistive circuit includes a reference current supply portion and a negative-feedback bias portion, said negative resistive circuit comprising:

first and second transistors Q32 and Q33 receiving a first reference current I1 from said reference current supply portion;

third and fourth transistors Q31 and Q34 receiving a second reference current I2 from said reference current supply portion;

a biasing transistor Q35 coupled to a first resistor R6 and connected to a node between a first set of serially-connected resistors R3 and R4, said first set of serially-connected resistors R3 and R4 being connected at opposite ends to the respective emitters of said second and fourth transistors Q33 and Q34; and fifth transistor Q36 coupled to a second resistor R5 and connected to a node between a second set of serially-connected resistors R1 and R2, said second set of serially-connected resistors connected at opposite ends to the respective emitters of said first and third transistors Q31 and Q32, the respective bases of said second and fourth transistors Q33 and Q34 being connected respectively to the collector (node N2) of said first transistor Q31 and to the collector (node N1) of said third transistor Q32, such that a voltage potential $V_{zin}$ and a current $I_{zin}$ at the collector (node N2) of said first transistor Q31, are in negative-resistive characteristic relationship.

13. The PLL circuit of claim 12, wherein said reference current supply portion includes third and fourth resistors R8 and R7, said first and second reference currents I1 and I2 coming from a supply voltage source and associated with a corresponding one of fifth and sixth transistors Q37 and Q38 connected to respective ones of said third and fourth resistors R8 and R7 to form a current mirror with seventh transistor Q40, the current values of said first and second reference currents I1 and I2 being of equal value.

14. The PLL circuit of claim 12, wherein the resistance values of said first set and second set of serially connected resistors are as follows:

R1=R2>R3=R4.

15. The PLL circuit of claim 13, wherein the resistance values of said first set and second set of serially connected resistors are as follows:

R1=R2>R3=R4.

16. The PLL circuit of claim 11, wherein said variable frequency oscillating circuit further comprises:
    a first condenser connected between an output terminal of the first transconductance (gm) amplifying stage and a non-inverting (+) terminal of the second transconductance (gm) amplifying stage; and
    a second condenser connected between an output terminal of the second transconductance (gm) amplifying stage and an inverting (−) terminal of the first transconductance (gm) amplifying stage.

17. The PLL circuit of claim 12, wherein said variable frequency oscillating circuit further comprises:
    a first condenser connected between an output terminal of the first transconductance (gm) amplifying stage and a non-inverting (+) terminal of the second transconductance (gm) amplifying stage; and
    a second condenser connected between an output terminal of the second transconductance (gm) amplifying stage and an inverting (−) terminal of the first transconductance (gm) amplifying stage.

18. The PLL circuit of claim 13, wherein said variable frequency oscillating circuit further comprises:
    a first condenser connected between an output terminal of the first transconductance (gm) amplifying stage and a non-inverting (+) terminal of the second transconductance (gm) amplifying stage; and
    a second condenser connected between an output terminal of the second transconductance (gm) amplifying stage and an inverting (+) terminal of the first transconductance (gm) amplifying stage.

19. The PLL circuit of claim 14, wherein said variable frequency oscillating circuit further comprises:
    a first condenser connected between an output terminal of the first transconductance (gm) amplifying stage and a non-inverting (+) terminal of the second transconductance (gm) amplifying stage; and
    a second condenser connected between an output terminal of the second transconductance (gm) amplifying stage and an inverting (−) terminal of the first transconductance (gm) amplifying stage.

20. The PLL circuit of claim 15, wherein said variable frequency oscillating circuit further comprises:
    a first condenser connected between an output terminal of the first transconductance (gm) amplifying stage and a non-inverting (+) terminal of the second transconductance (gm) amplifying stage; and
    a second condenser connected between an output terminal of the second transconductance (gm) amplifying stage and an inverting (−) terminal of the first transconductance (gm) amplifying stage.

* * * * *